United States Patent [19]

Richards et al.

[11] Patent Number: 4,684,897

[45] Date of Patent: Aug. 4, 1987

[54] FREQUENCY CORRECTION APPARATUS

[75] Inventors: Gerald P. Richards; Andre M. Renard, both of Framingham, Mass.

[73] Assignee: Raytheon Company, Lexington, Mass.

[21] Appl. No.: 567,828

[22] Filed: Jan. 3, 1984

[51] Int. Cl.$^4$ .................... H03K 5/00; G06G 7/10; H03L 1/00

[52] U.S. Cl. .................... 328/162; 328/15; 328/140; 307/491; 307/591; 307/310; 331/176

[58] Field of Search .................... 328/55, 56, 15, 162, 328/137, 140, 141, 3; 307/510, 529, 271, 310, 491, 591, 606; 331/176, 177 R

[56] References Cited

U.S. PATENT DOCUMENTS

| | | | |
|---|---|---|---|
| 3,005,960 | 10/1961 | Levenson | 328/15 |
| 3,641,442 | 2/1972 | Boucher | 377/75 |
| 3,817,582 | 6/1974 | Green et al. | 328/55 |
| 3,938,316 | 2/1976 | Morokawa et al. | 307/310 |
| 3,947,638 | 3/1976 | Blankinship | 328/55 |
| 3,993,957 | 11/1976 | Davenport | 328/56 |
| 4,034,309 | 7/1977 | Vaughn | 331/1 A |
| 4,237,420 | 12/1980 | Ebihara et al. | 307/310 |
| 4,290,022 | 9/1981 | Puckette | 328/55 |
| 4,316,148 | 2/1982 | Kaminski | 328/55 |
| 4,330,750 | 5/1982 | Mayor | 328/55 |
| 4,414,637 | 11/1983 | Stanley | 328/55 |
| 4,443,766 | 4/1984 | Belton, Jr. | 328/151 |

Primary Examiner—Stanely D. Miller
Assistant Examiner—Timothy P. Callahan
Attorney, Agent, or Firm—Peter J. Devlin; Richard M. Sharkansky; Denis G. Maloney

[57] ABSTRACT

A frequency correction apparatus having a delay line fed by an input signal, the frequency of such signal being corrected a predetermined amount, $\Delta f$. The delay line has a plurality of output taps regularly disposed along the line. The output taps produce a plurality of successively time-delayed signals each one having the frequency of the input signal. A switching network is included for successively coupling each one of the plurality of time-delayed signals to an output terminal of a predetermined coupling change rate related to $\Delta f$, to produce, at such output terminal, an output signal having a frequency shifted from the frequency of the input signal the predetermined amount required for the desired frequency correction. When the taps are successively coupled to the output terminal in a direction along the delay line away from the input to such line, the frequency of the output signal is equal to the frequency of the input shift shifted lower in frequency the amount $\Delta f$. On the other hand, when the taps are successively coupled in a direction towards the line input, the frequency of the output signal is shifted higher in frequency the amount $\Delta f$.

10 Claims, 23 Drawing Figures

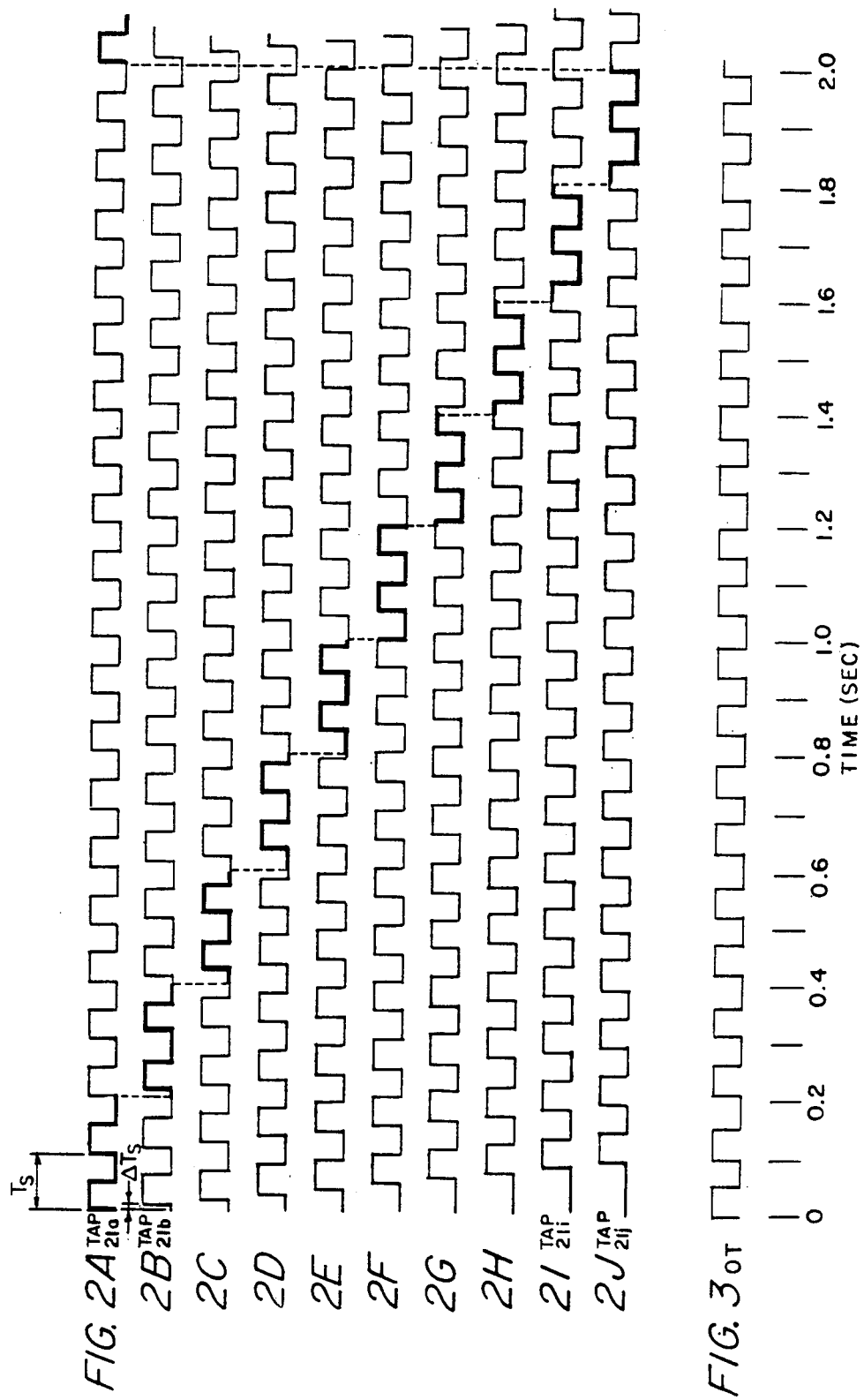

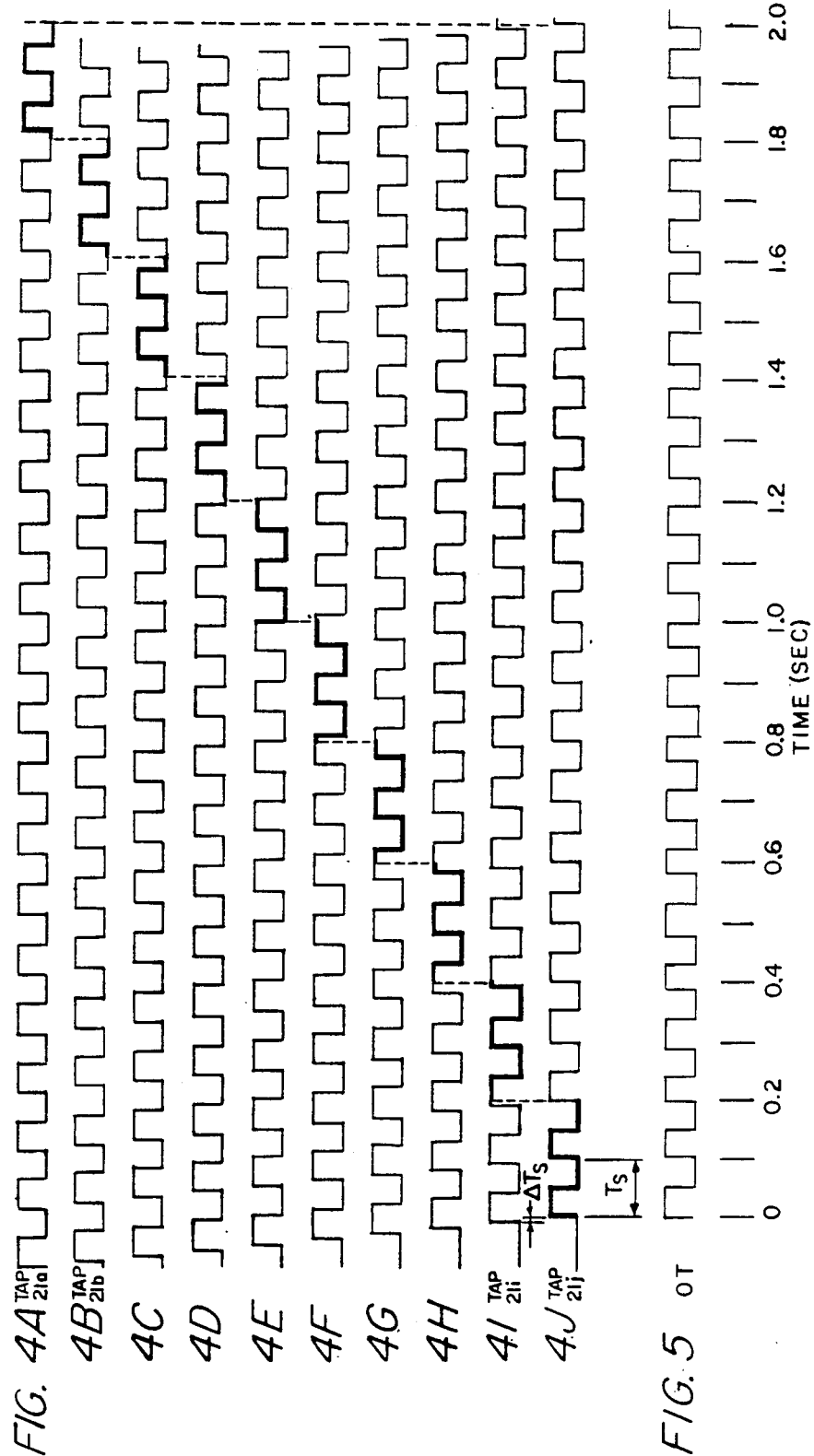

FREQUENCY CORRECTION APPARATUS

BACKGROUND OF THE INVENTION

This invention relates generally to frequency correction apparatus and, more particularly, to frequency correction apparatus adapted to correct the frequency error in a reference signal produced in an oscillator and caused by variations in the environment of the oscillator.

As is known in the art, the frequency of a reference signal may vary as a function of the operating environment, such as the temperature of the source of such signal. Correction of such variations in the frequency of the signal source is usually achieved by either analog or hybrid digital-analog techniques. Analog techniques include the product modulation of the desired frequency modulation spectrum on the source signal. Hybrid techniques often employ a phase-locked loop with an inverted phase version of the desired modulation added to the phase detector output thereby tracking the desired modulation into the VCO frequency. Either technique has great difficulty with the requirement of extremely accurate modulation, particularly at extremely low modulation frequencies.

SUMMARY OF THE INVENTION

In accordance with the present invention, frequency correction apparatus is provided comprising: means for producing a plurality of successively time-delayed signals, each one having the same frequency; and, means for successively coupling each one of the plurality of time-delayed signals to an output terminal at a predetermined coupling change rate producing an output signal having a frequency shifted from the predetermined frequency an amount related to the predetermined coupling rate of change.

In a preferred embodiment of the invention, a periodic input signal having a frequency ($f_s$), shifted in frequency from a reference frequency an amount $f_E$, is fed to a delay line having a plurality of output taps regularly distributed along the delay line. The output taps produce the plurality of successively time delayed signals. In each second, the input signal is delayed in the delay line a number of cycles equal to the number of cycles of the error frequency, $f_E$, per second. The error frequency, $f_E$, is determined in accordance with the temperature of a source of the input signal. The input signal is delayed in time in the delay line an amount $\Delta T_s$ so that the input signal is delayed in the delay line $\Delta T_S/T_S$ (where $T_s = 1/f_s$) of a cycle of the input signal per output tap position. The output taps are successively coupled to an output terminal at a coupling rate $N_T$ taps per second such that $N_T(\Delta T_S/T_S)$ equals the error frequency $f_E$, with the result that the signal produced at the output terminal has an average frequency equal to the frequency of the source signal but shifted by the error frequency, $f_E$. If the taps are successively coupled to the output terminal in a direction along the delay line away from the signal source, the frequency of the output signal is $f_s - f_E$, whereas if the taps are successively coupled to the output terminal in a direction towards the source, the frequency of the output signal is $f_s + f_E$. Thus, with proper coupling of the output taps to the output terminal, a source signal of frequency $f_s = f_{so} \pm f_E$ can be shifted in frequency to produce an output signal having an average frequency $f_{so}$.

To put it another way, a periodic input signal having a frequency ($f_s$), in error with respect to the desired frequency by $f_E$, is fed to a delay line whose period is an integral number of cycles of the input frequency $f_s$. This delay line contains a plurality of output taps regularly distributed along the line. An output is produced not by observing the waveform at a specific tap but, rather, by constantly altering the observation tap at a rate such that the delay line is totally traversed with the observation point $f_E$ times per second for a delay line one-cycle in length. If the observation point moves away from the source end of the line, then the frequency observed at the output will be $f_s - f_E$, whereas if the observation point moves toward the source end, the observed frequency will be $f_s + f_E$. Note that because the delay line is an integral number of $f_s$ cycles in length (typically one cycle in length), when the observation point reaches either end of the delay line the observation point (i.e., the selected output tap) simply jumps to the other end of the delay line and continues to move in the desired direction.

By digitally realizing the delay line as a series of shift register storage devices driven in the shift sense by a clock produced from a frequency multiplying phase lock loop which multiplies the source frequency by the number of stages, N, in the shift register ensures that a delay exeeding the delay line length will be exactly simulated by simply recycling the selected output tap to the beginning (or end) of the line (depending on whether the frequency is to be increased or decreased) because the delay per tap is fixed at an integral sub-multiple (i.e., 1/N) of the source input signal frequency.

BRIEF DESCRIPTION OF THE DRAWINGS

For a more complete understanding of the concepts of this invention, reference is now made to the following description taken together in conjunction with the accompanying drawings in which:

FIGS. 2A–2J are time histories of the signals produced at the output of each of the stages of a digital shift register delay line used in the apparatus shown in FIG. 1, such apparatus operating to reduce the frequency of a signal source;

FIG. 3 is a time history of a signal produced at the output of the apparatus of FIG. 1, such apparatus operating to reduce the frequency of an input signal;

FIGS. 4A–4J are time histories of the outputs of a digital shift register delay line used in the apparatus shown in FIG. 1, where the frequency of a source fed to the apparatus is to be increased in frequency; and FIG. 5 is the output wave form of the apparatus shown in FIG. 1 as the result of increasing the frequency of the input signal.

DESCRIPTION OF THE PREFERRED EMBODIMENT

Figure 1:
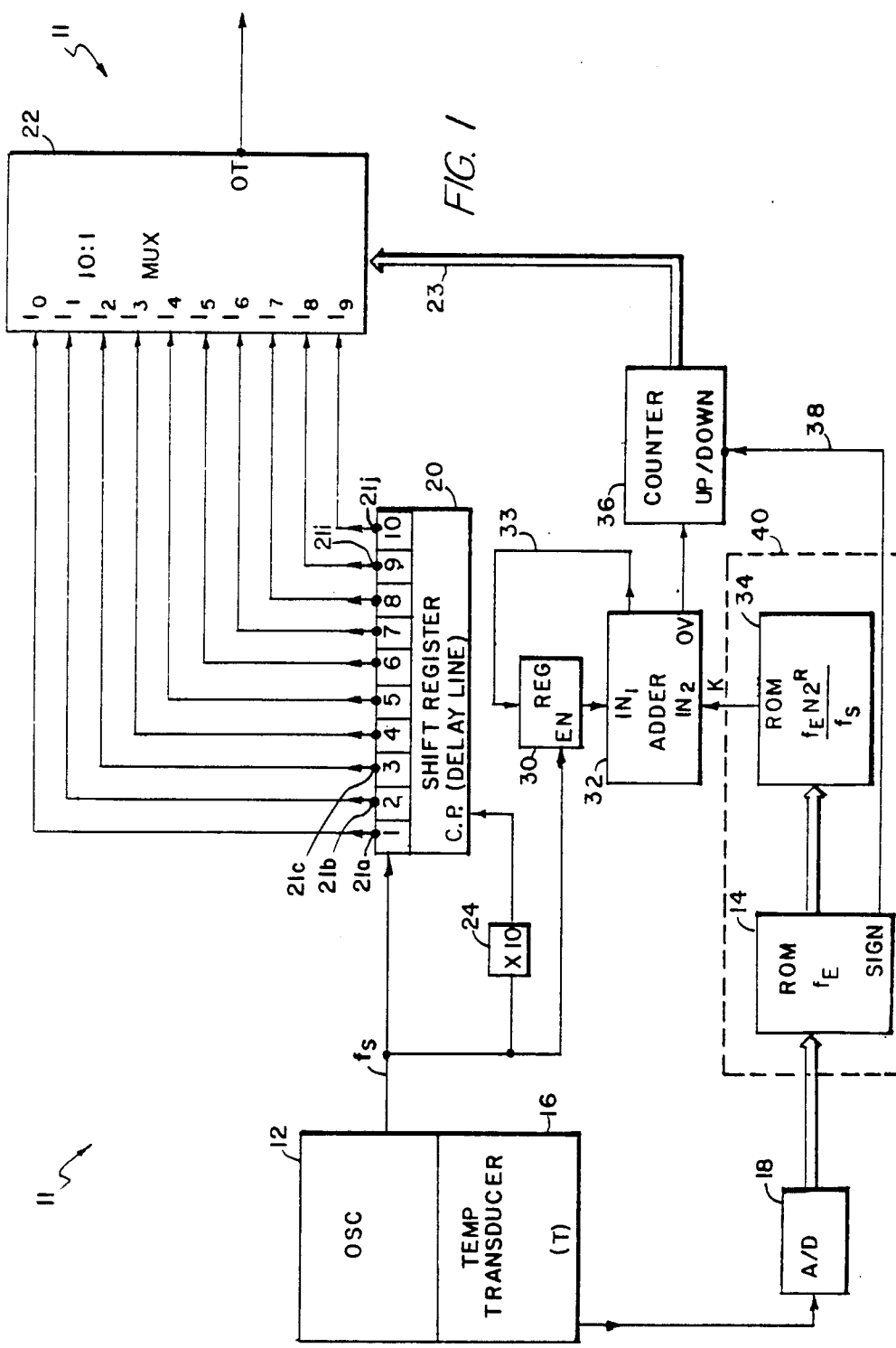
FIG. 1 is a block diagram of a frequency correction apparatus according to the invention.

Referring now to FIG. 1, the frequency correction apparatus 11 is shown coupled to the output of a frequency signal source 12, here a crystal oscillator. Frequency correction apparatus 11 is used to correct for the variations in the frequency of the signal produced at the output of source 12 resulting from variations in the temperature of the source 12. Thus, while the source 12 produces an output signal having a nominal frequency $f_{so}$ at a nominal operating temperature $T_o$, the frequency of the source 12 varies from the frequency $f_{so}$ an amount ±$f_E$ related to the temperature T of the source 12. The functional relationship between $f_E$ (the error frequency) and T (the source temperature) is determined a priori and, once determined, is stored in a digital memory 14 (here a conventional read-only memory, ROM). The data is stored in the ROM 14 such that when ROM 14 is addressed by a digital word representative of the temperature of the oscillator 12, the ROM 14 produces a digital output signal representative of the error frequency $f_E$. A conventional temperature transducer 16, here a thermocouple in thermal equivalence with the crystal resonator of the oscillator of source 12, produces an electrical signal having an amplitude representative of the temperature T. The produced electrical signal is converted into a corresponding digital signal by a conventional analog-to-digital (A/D) converter 18, the digital output of such A/D converter 18 being fed to the addressed terminals of ROM 14.

Apparatus 11 includes a delay line 20 fed by the signal produced by the source 12. The delay line 20 has a plurality of output taps 21a-21j distributed in regular succession across the delay line 20 as shown. The output taps 21a-21j are coupled to the input terminals $I_0$-$I_9$ of multiplexer 22. At any instant of time, in response to a control word fed to the multiplexer 22 via bus 23, a selected one of the output taps 21a-21j is coupled to the output terminal OT of the multiplexer 22. In each second of time the input signal fed to the delay line 20 from source 12 is delayed in such delay line 20 the number of cycles equal to the number of cycles of the error frequency, $f_E$, per second. To put it another way, in each second of time the selected tap has been increased (or decreased) in delay line address such that a delay equal to the period of $f_E$ cycles of the input 12 has been added (or deleted) from the delay line. It is noted that the equality of the delay line period with the input signal period (1/$f_s$) means that a delay exceeding the delay line length can be simulated by simply recycling to the beginning of the delay line (or to the end of the delay line in the case of decreasing frequency). Thus, if the input or source signal is delayed in time $\Delta T_s$ per output tap position, it follows that ($\Delta T_s$)/$T_s$ of a cycle of the input signal will be delayed in time per tap position where $T_s = 1/f_s$. Thus, if $N_T$ output taps are successively coupled to the output terminal OT in each second such that $N_T((\Delta T_s)/T_s)$ equals the error frequency, $f_E$, the average frequency of the signal produced at the output terminal OT will be shifted in frequency $f_E$. Thus, for a frequency shift, $f_E$:

$$f_E = ((\Delta T_s)/T_s)N_T$$

and hence $$N_T = f_E[T_s/(\Delta T_s)].$$

Further, if the output taps 21a-21j are successively coupled to the output terminal OT in a direction away from the source 12, the frequency of the signal produced at the output terminal will be $f_s - f_E$, whereas if the output taps 21a-21j are successively coupled to the output terminal OT in a direction towards the source 12, the frequency of the output signal will be ($f_s + f_E$). Thus, if at a temperature T the source signal frequency $f_s = f_{so} + f_E$, where $f_{so}$ is the desired reference frequency, the output taps 21a-21j are successively and repetitively coupled to the output terminal OT at the rate $N_T$ tap positions per second so that the average frequency of the signal produced at the output terminal OT is $f_s - f_E = f_{so}$, whereas if at the temperature, T, the source signal frequency is $f_s = f_{so} - f_E$, the taps are successively and repetitively coupled to such output terminal OT so that the average frequency of the output signal at the output terminal is $f_s + f_E = f_{so}$. Thus, in either case, apparatus 11, in response to the temperature of the source 12, corrects for temperature produced errors in the frequency of the source to maintain such frequency substantially equal to the desired reference frequency, $f_{so}$, independently of the temperature T.

Here, the delay line 20 is a ten-stage digital shift register. Thus, after the source signal has been converted to a square wave by a one-bit analog-to-digital converter (not shown), it is fed to the first stage (i.e., stage 1) of the shift register 20. (It is noted that since only one bit quantization of the source signal is required, the analog-to-digital conversion can be provided by the shift register itself.) When the source signal has a level greater than its average value, typically 0 volts, a logical one is stored in the first stage of the shift register in response to a clock pulse fed to the terminal CP of such shift register, whereas when the source signal has a level less than its average value, a logical 0 is stored in the first stage of the shift register. Further, the clock pulses fed to the shift register terminal CP is a multiple N (where N is greater than 1, here N equal to 10) greater than the frequency of the input signal. Thus, here a 10-to-1 frequency multiplier 24 (here a voltage controlled oscillator (VCO)) frequency divided by ten and phase locked to the input signal to provide a 10:1 multiplication of the input signal, is used as the clock pulse signal for the shift register 20. Each one of the storage stages 1 to 10 of the register is coupled to a corresponding one of the 10 output taps 21a-21j. Thus, since the data shifts through the shift register at the clock pulse rate, here $f_{cp}$, here 10 $f_s$, the input signal is time delayed between successive output taps an amount $\Delta T_s = 1/f_{cp} = 1/(Nf_s)$. Thus $N_T = Nf_E$; that is, the output taps 21a-21j must be successively and repetitively coupled to the output terminal OT at a rate of $N_T = Nf_E$, here at a rate 10 $f_E$ taps per second, in order to shift the frequency of the source signal $f_E$ cycles per second.

By way of example, consider an input signal having a frequency of 10 cycles per second as shown in FIG. 2A. (It is noted that the example given below illustrates the operation of the apparatus in correcting for an error of 0.5 cycles per second out of 10 cycles per second, the apparatus would be in the more typical case, operate to correct for errors of several hundred Hz out of a source signal having a frequency of several MHz.) The signal appears at the output terminal 21a as shown in FIG. 2A, substantially undelayed in time. The signals appearing at output taps 21b-21j are shown in FIGS. 2B-2J, respectively. It is first noted that in this example the delay line 20 has a length equal to the period $T_s$ of the source signal and because of the locked clocking rate of 10:1, the delay provided by the delay line will always be equal to $T_s$. Hence, if the fundamental frequency component of the signal produced at the output tap 21a is represented as f(t), the signals produced at taps 21b-21j may be represented as f(t+$\Delta T_s$), ... f(t+9 $\Delta T_s$), respectively. Thus, the shift register 20 produces a plurality of successively delayed output signals, each one having the same predetermined frequency component $f_s$ but delayed in time one with respect to another a predetermined amount, here $\Delta T_s$. Here, in this example, $f_E$ is 0.5 cycles per second. Thus, $N_T$ equals 5 taps per second. This is, the output taps 21a-21j must be coupled to the output terminal OT of multiplexer 22 a rate of 5 taps per second, or, to put it another way, each output tap is successively coupled to the output terminal for 0.2 seconds. Thus, since the period of the source signal is 0.1 seconds, each output tap is successively coupled to the output terminal OT for 2 input signal cycles. Referring to FIGS. 2A-2J, the first two cycles of the signal produced at output tap 21a are coupled to output terminal OT from t=0 to t=0.2 seconds, as shown by the bold portion of the wave form in FIG. 2A. Subsequently, during the third and fourth cycles of the source signal (i.e., from t=0.2 to t=0.4 seconds), the output produced at output tap 21b is coupled to the output terminal OT as shown by the bold portion of the wave form shown in FIG. 2B. Continuing, during the fifth and sixth cycles of the source signal, the signal produced at output tap 21c is coupled to the output terminal OT as shown by the bold portion of the wave form in FIG. 2C. The process thus continues so that after each two cycles of the source signal, the taps are sequentially coupled to the output terminal OT and whereafter the last output tap is coupled to the output terminal OT, the process thus repeats anew at the beginning of the delay line. The signal produced at the output of output terminal OT is shown in FIG. 3 and is basically a composite of the bold portions of the wave forms shown above in FIGS. 2A-2J. It is thus noted that whereas the source signal has a frequency of $f_s = 10$ cycles per second, the average frequency of the signal produced at the output terminal OT is here 9.5 cycles per second.

Referring again to FIG. 1, the circuitry for successively coupling the output taps 21a-21j of the shift register 20 to the output terminal OT of multiplexer 22 will now be described. The circuitry basically includes a counter 36 which addresses the multiplexer 22, such counter 36 incrementing or decrementing (depending on whether the correction is to decrease the source frequency or increase the source frequency) each time the proper number of input signal cycles have transpired. In response to the leading edge of each one of the input pulses fed to the shift register 20, an R-bit register 30 is enabled to store therein the binary data presented at the output of the binary adder 32. Adder 32, here an R-bit adder, has a pair of input terminals $IN_1$, $IN_2$. The input terminal $IN_1$ is connected to the output of register 30 and the input terminal $IN_2$ is coupled to the output of a ROM 34 as shown. The output of the adder 32 is coupled to the input of register 30 via line 33. The overflow terminal (OV), or carry terminal, of adder 32 is connected to the input of a counter 36. Counter 36 is an up/down counter, such counter 36 being placed in the up-count or down-count mode selectively in accordance with the signal fed to the up/down terminal of counter 36 via line 38 as shown. Here it is assumed that the counter is in the up-count mode. The output of the counter 36 provides the address for the multiplexer 22 via bus 23; counts of $(0)_{10}$ through $(9)_{10}$ coupling, respectively, input terminals $I_0$ to $I_9$ to the output terminal OT of the multiplexer 22. Thus, for the example described above, it is desired that the input terminals $I_0$ to $I_9$ are successively and repetitively coupled to the output terminal OT after two cycles of the input signal. Thus, it follows that the adder 32 for this example must overflow once for every two input cycles of the source signal. That is, to put it another way, the adder must overflow at a rate of $N_T = 10 f_E = 5$ times per second to switch the output terminal OT from one tap position to the next once every two cycles of the input signal. Since the output of the adder 32 is fed to the input of the register 30 via line 33, and since register 30 is enabled in response to each cycle of the input signal, a constant K must be coupled to the second input $IN_2$ of the adder 32 (where K equals $(N_T)(2^R)/f_s$ equals $(f_E)(N)(2^R)/f_s$) in order for adder 32 to overflow at the rate $N_T$ (where $f_s = f_{so} + f_E$) or one tap portion per two cycles of the input signal. The constant K is provided by ROM 34. ROM 34 is addressed by the output of ROM 14 which provides the error frequency $f_E$. It follows then that the measured temperature, after being converted to a digital signal by A-to-D converter 18, provides the constant K, which must be fed to the second input $IN_2$ of the adder 32 to enable the adder 32 to operate at the proper overflow rate of 5 overflows per second. (It is noted that a single ROM may be used in place of the two separate ROMs 14 and 34 to, in effect, store data representing the relationship between K and the measured temperature T provided by temperature transducer 16.) Thus, here, for R=2 and $f_E = 0.5$ cycles per second, thus $K = (2)_{10}$.

By way of a second example, let it be considered that the temperature of the oscillator or source 12 is such that the frequency error $f_E$ is lower than the desired frequency $f_s$ by 0.5 cycles per second. In this case, the output of ROM 14 would place the counter 36 in a down-count mode, producing the wave forms as shown in FIGS. 4A-4J at output taps 21a-21j, respectively, with the composite output signal at the output terminal OT being shown by the wave form in FIG. 5. It is noted that here with the frequency of the input signal of the source 10 cycles per second, the frequency of the signal produced at the output terminal OT is 10.5 cycles per second. Thus, in either case (that is, whether the frequency of the source is to be increased or decreased in each second), the input signal is delayed in time in the delay line a number of cycles equal to the frequency error and the output taps of the delay line are successively coupled to the output terminal OT at a rate $N_T$ such that the rate of change of the taps ($N_T$) times the portion of the cycles delayed in the delay line ($\Delta T_s/T_s$) is equal to the number of cycles in the frequency error $f_E$.

As noted above, while an example has been used showing operation of the apparatus in correcting a frequency of 0.5 Hz out of 10.0 Hz, the apparatus would typically be used to correct for errors of up to several hundred Hz out of several MH. In this more typical operation, rather than fed to source signal having frequency $f_s$ directly to the enable terminal EN of register 30, as shown in FIG. 1, the source signal would fed into a frequency divider. The frequency divider would provide a signal having a frequency ($f_s/M$) (where M is an integer) and would then feed the enable terminal EN of the register 30. Thus the enable terminal EN would not be fed with a signal having a frequency $f_s$ but, rather, would be fed with a signal having a frequency ($f_s/M$). In this case, the constant K coupled to the second input $IN_2$ of the adder 32 in order for the adder 32 to overflow at the rate MT will be equal to: $K = (f_E)(N)(2^R)(M)/f_s$.

Having described a preferred embodiment of the invention, it is now evident that other embodiments incorporating these concepts may be used. For example, while a digital delay line has been shown, an analog delay line may be used. However, where an analog delay line is used having a length equal to the period of the nominal input signal, there is a shift error whereas using the digital delay line phase locked to the input signal as described, there is a precise equality of the delay line period with the input signal period, ensuring that a delay exceeding the line length can be exactly simulated by simply recycling to the beginning of the line, or to the end of the line, depending on whether an increase, or decrease, in frequency correction is required. It is felt, therefore, that this invention should not be restricted to the disclosed embodiment but, rather, should be limited only by the spirit and scope of the appended claims.

What is claimed is:

1. In combination:
   (a) means for producing a plurality of successively time-delayed signals, each one having the same frequency and varying from a nominal frequency in accordance with variations in the operating environment of the producing means; and
   (b) means, responsive to a control signal representative of said variations in the operating environment of said producing means, for successively coupling each of the plurality of time-delayed signals to an output terminal at a predetermined coupling change rate, said predetermined coupling change rate being selected to provide a signal at the output terminal having a frequency substantially equal to the nominal frequency substantially independent of said variations in the operating environment of the producing means.

2. The apparatus recited in claim 1 wherein the producing means comprises a delay line having a plurality of output taps distributed along the line from an input of such line, such plurality of time-delayed signals being produced at the output of the taps in response to an input signal fed to the input of the line.

3. The apparatus recited in claim 2 wherein the delay line comprises a digital delay line.

4. The apparatus recited in claim 3 wherein the digital delay line includes means for shifting samples of the input signal fed to the delay line and through the delay line at a predetermined clock rate, such clock rate being an integer multiple of the frequency of the input signal.

5. Frequency correction apparatus, comprising:
   (a) a delay line means having a plurality of output taps disposed along the delay line means;
   (b) means for producing an input signal and for coupling said input signal to an input of the delay line means, said input signal having an instantaneous frequency fs which varies from a nominal frequency $f_{so}$ by an amount $\pm f_E$ as a function of the temperature of the input signal producing means;
   (c) said delay line means comprising means for producing at the plurality of output taps a plurality of time-delayed output signals, the signals having the frequency $f_s$ and being shifted in time one with respect to another a predetermined amount $\Delta T_s$; and
   (d) means, repsonsive to the temperature of the input signal producing means and fed by the plurality of output signals, for coupling each one of the output signals to an output terminal at a coupling change rate equal to $N_T$ output taps per second, said coupling change rate $N_T$ being selected to produce a signal at the output terminal having a frequency $f_{so} = f_s \mp f_E$ where $f_E = (\Delta T_s)f_s N_T$.

6. The apparatus recited in claim 5 wherein the delay line comprises a digital delay line and means responsive to the input signal, for shifting the input signal through the delay line to the output taps thereof at a clocking rate which is a predetermined multiple integer of the frequency of the input signal.

7. Apparatus for correcting the frequency of an input signal generated by a source, the input signal having a frequency $f_s$ varying from a nominal frequency $f_{so}$ by a predetermined amount $\pm f_E$ in accordance with the temperature of the source, said apparatus comprising:
   (a) a delay line means having a plurality of output taps distributed in succession across the delay line means, the input signal being fed to the delay line, said delay line means delaying the input signal as it passes through the delay line means an amount $\Delta T_s$ as the input signal passes between successive output taps;
   (b) means for producing a control signal corresponding to the temperature of the source; and
   (c) means, responsive to the control signal, for successively coupling the distributed output taps to an output terminal at a coupling change rate of $N_T$ output taps per second corresponding to the temperature of the source, the coupling change rate $N_T$ being equal to $f_E/(f_s \Delta T_s)$, to produce a signal at the output terminal having a frequency $f_{so} = f_s \mp f_E$.

8. The apparatus recited in claim 7 wherein the delay line means includes an N stage digital shift register and means for shifting samples of the input signal through the delay line means at the rate $1/\Delta T_s$ where $T_s = 1/Nf_s$, $N_T = Nf_E$ and N is an integer.

9. A frequency correction system comprising:
   means for generating a reference signal having a predetermined, nominal frequency, the frequency of the reference signal varying from said predetermined, nominal frequency as a function of the temperature of the reference signal generating means;
   means for producing a control signal corresponding to the temperature of the reference signal generating means;
   delay line means, fed by the reference signal, for producing a plurality of successively time-delayed signals, each one of said successively time-delayed signals having the same frequency as that of the reference signal; and
   means, responsive to the control signal, for successively coupling each one of the plurality of time-delayed signals to an output terminal at a coupling change rate corresponding to the temperature of the reference signal generating means, said coupling change rate being selected to provide a signal at said output terminal having an frequency substantially equal to the predetermined, nominal frequency and substantially independent of the temperature of the reference signal generating means.

10. The combination of claim 1 wherein the variations in the environment of the producing means comprise changes in the temperature of the producing means.

* * * * *